United States Patent
Nishizawa

(10) Patent No.: US 7,782,131 B2
(45) Date of Patent: Aug. 24, 2010

(54) BALANCED AMPLIFIER AND ELECTRONIC CIRCUIT

(75) Inventor: Tatsuya Nishizawa, Saitama (JP)

(73) Assignee: Pioneer Corporation, Tokyo (JP)

( * ) Notice: Subject to any disclaimer, the term of this patent is extended or adjusted under 35 U.S.C. 154(b) by 156 days.

(21) Appl. No.: 12/066,276

(22) PCT Filed: Sep. 6, 2006

(86) PCT No.: PCT/JP2006/317646

§ 371 (c)(1),
(2), (4) Date: Apr. 29, 2008

(87) PCT Pub. No.: WO2007/029737

PCT Pub. Date: Mar. 15, 2007

(65) Prior Publication Data

US 2009/0134940 A1    May 28, 2009

(30) Foreign Application Priority Data

Sep. 9, 2005    (JP)    ............................. 2005-262027

(51) Int. Cl.
*H03F 3/45* (2006.01)
(52) U.S. Cl. .......................... 330/69; 330/252; 330/260
(58) Field of Classification Search .................. 330/69, 330/252, 260
See application file for complete search history.

(56) References Cited

U.S. PATENT DOCUMENTS

| 4,206,416 | A | * | 6/1980 | Kellogg | 330/69 |
| 5,075,633 | A | * | 12/1991 | Bowers | 330/69 |
| 5,365,188 | A |   | 11/1994 | Botti et al. | |
| 5,822,426 | A | * | 10/1998 | Rasmus et al. | 379/402 |
| 5,963,088 | A | * | 10/1999 | Czarnul et al. | 330/69 |
| 5,990,737 | A | * | 11/1999 | Czarnul et al. | 330/69 |
| 6,160,446 | A | * | 12/2000 | Azimi et al. | 330/69 |

FOREIGN PATENT DOCUMENTS

| JP | 64-37110 A | 2/1989 |
| JP | 6-318830 A | 11/1994 |

\* cited by examiner

*Primary Examiner*—Patricia Nguyen
(74) *Attorney, Agent, or Firm*—Young & Thompson

(57) ABSTRACT

A balanced amplifier (1) is provided with: a first operational amplifier (11) whose reverse-phase input terminal is connected to an input voltage source (30) and whose reverse-phase input terminal is connected to an output terminal of the first operational amplifier; a second operational amplifier (12) whose positive-phase input terminal is connected to the input voltage source and whose reverse-phase input terminal is connected to an output terminal of the second operational amplifier; and a voltage division circuit (20i, 20j, 20k, 20l) for dividing a reference voltage supplied from a reference voltage source (40), the reference voltage source being connected to a positive-phase input terminal of each of the first operational amplifier and the operational amplifier through the voltage division circuit.

6 Claims, 3 Drawing Sheets

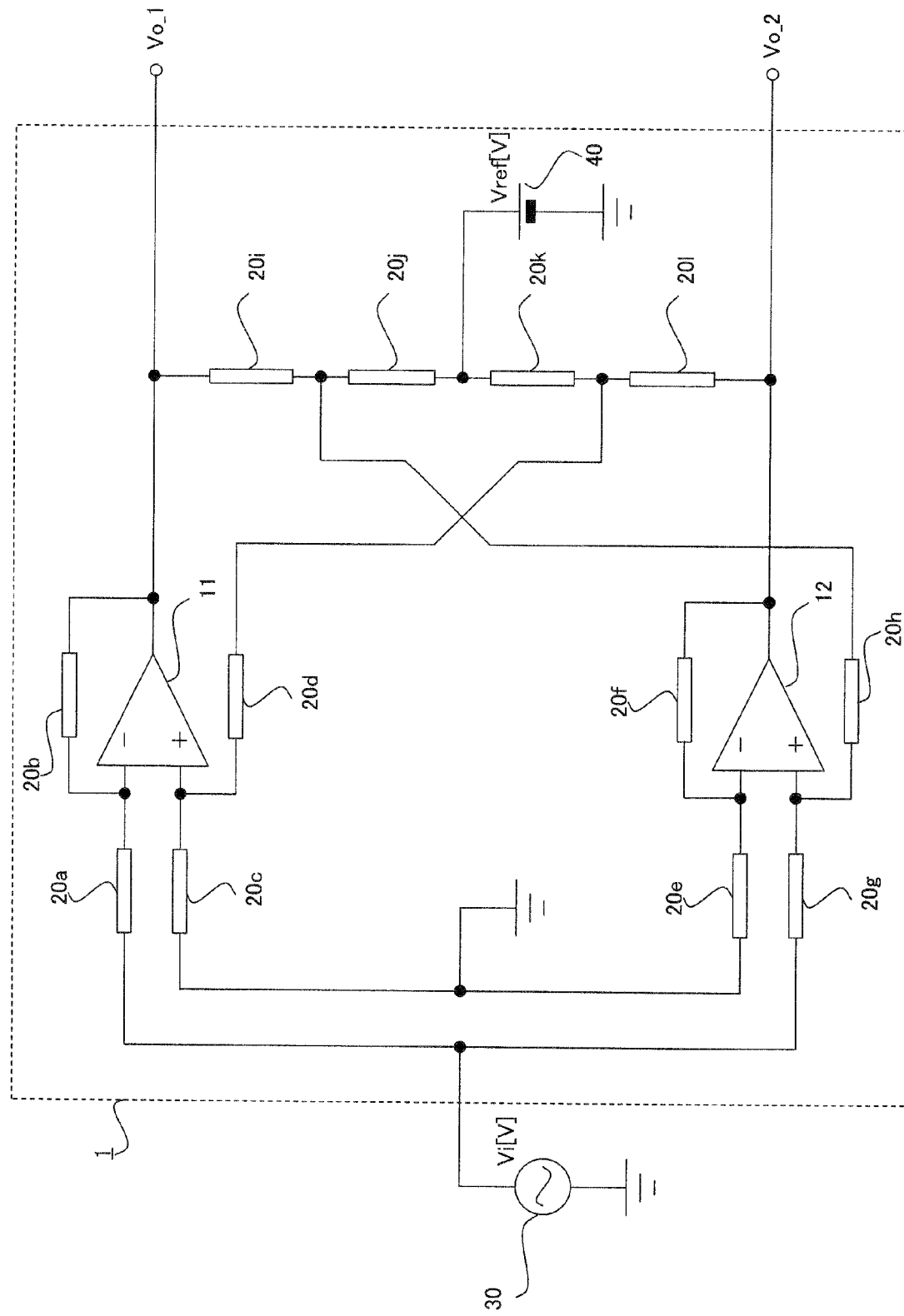
[FIG. 1]

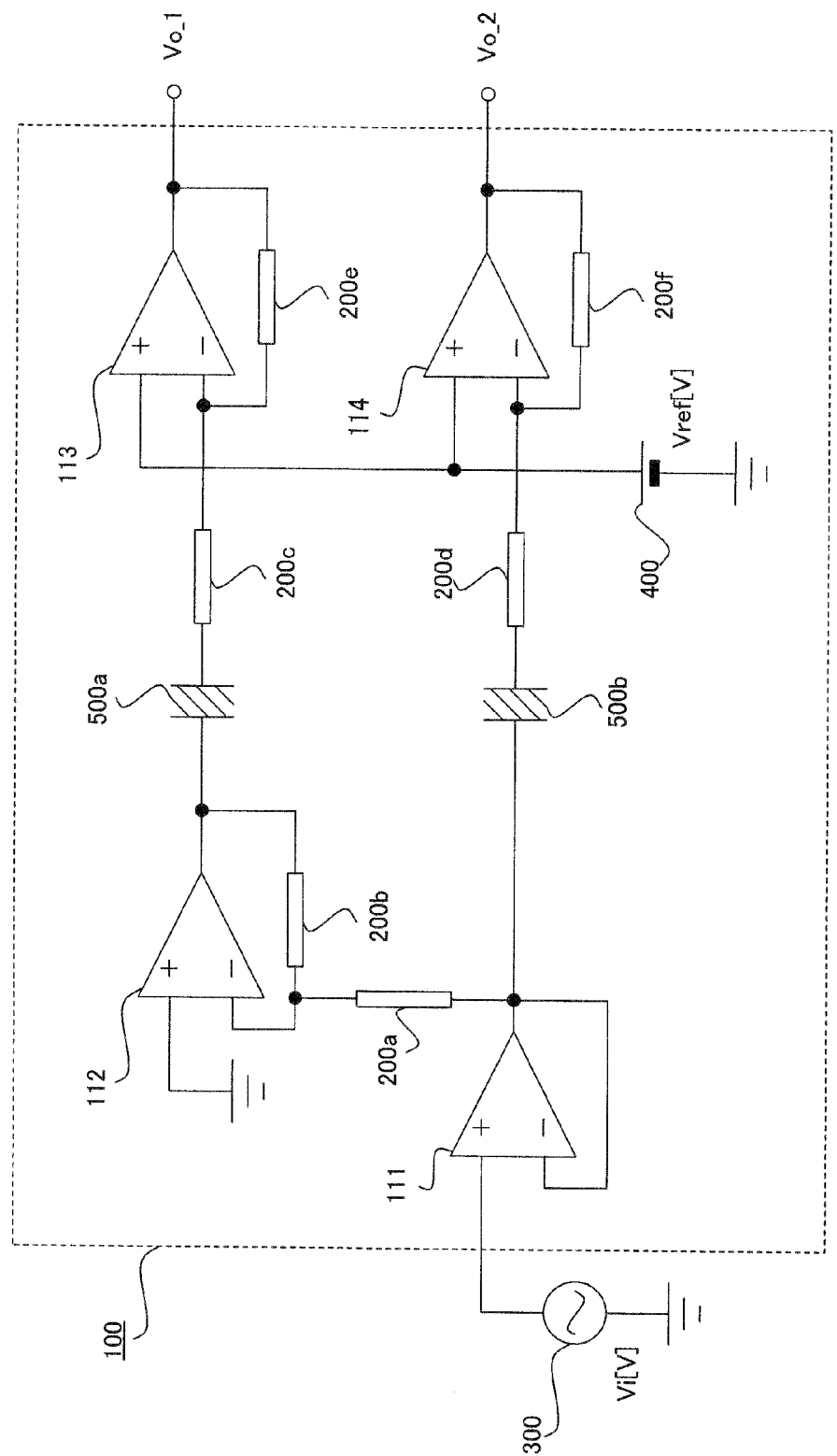
[FIG. 2]

[FIG. 3]
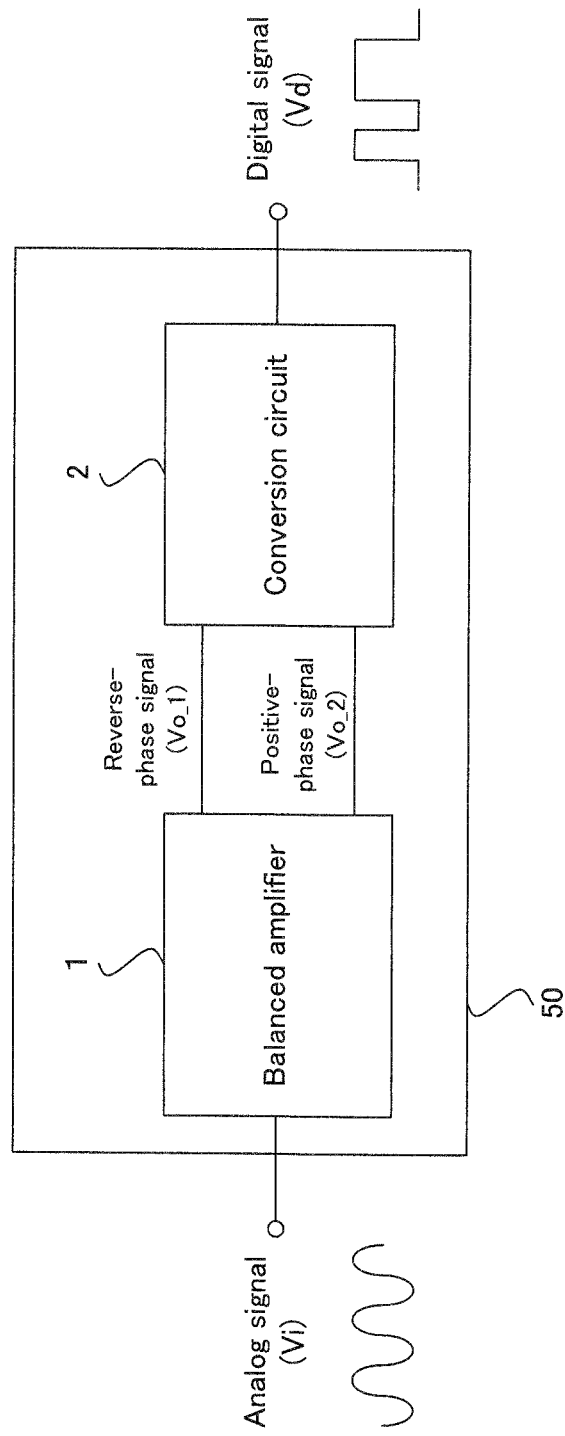

BALANCED AMPLIFIER AND ELECTRONIC CIRCUIT

TECHNICAL FIELD

The present invention relates to a balanced amplifier for outputting a balanced signal, used inside audio equipment, and an electronic circuit provided with the balanced amplifier.

BACKGROUND ART

For example, in the audio equipment, such as an amplifier, in order to realize a good S/N ratio when a digital signal is generated from an analog signal, a differential AD converter driving circuit is used. In the differential AD converter driving circuit, instead of generating the digital signal directly is from the single analog signal, each (i.e. balanced signal) of a positive-phase signal, which is in phase with the analog signal, and a reverse-phase signal, which is out of phase to the analog signal by 180 degrees, is generated (i.e. balanced signal is generated), and then the digital signal is generated from each of the positive-phase signal and the reverse-phase signal. At this time, the general differential AD converter driving circuit uses a source voltage of 5V. Thus, in generating the balanced signal, it is necessary to superimpose a direct current voltage (or reference voltage) of 2.5V which is about ½ of the source voltage, to each of the positive-phase signal and the reverse-phase signal.

It is possible to use the balanced amplifier, in order to superimpose the direct current voltage to each of the positive-phase signal and the reverse-phase signal, simultaneously with the generation of each of the positive-phase signal and the reverse-phase signal. The balanced amplifier generates the positive-phase signal by inputting the single analog signal to an operational amplifier with a gain of "+1" (i.e. to a non-inverting amplifier or a buffer amplifier), and then generates the reverse-phase signal by inputting the generated positive-phase signal to an operational amplifier with a gain of "−1" (i.e. inverting amplifier). In addition, the balanced amplifier superimposes the direct current voltage to each of the positive-phase signal and the reverse-phase signal by inputting each of the generated positive-phase signal and reverse-phase signal to a reverse-phase input terminal of an operational amplifier on which the direct current voltage is inputted to its positive-phase input terminal. At this time, the balanced amplifier prevents the direct current voltage from returning to the operational amplifiers for generating the positive-phase signal and the reverse-phase signal, by locating a capacitor between the operational amplifier for superimposing the direct current voltage and each of the operational amplifiers for generating the positive-phase signal and the reverse-phase signal.

DISCLOSURE OF INVENTION

Subject to be Solved by the Invention

The aforementioned balanced amplifier, however, generates the reverse-phase signal by inputting the generated positive-phase signal to another operational amplifier. That is, in order to generate the reverse-phase signal, it is necessary to use an extra operational amplifier, compared to a construction which generates the positive-phase signal, so that there is such a technical problem that a slight delay in time (or phase shift) occurs between the generated positive-phase signal and reverse-phase signal. Moreover, a noise characteristic and a distortion characteristic or the like are also caused by each of the operational amplifiers, so that there is also such a technical problem that the noise characteristic and the distortion characteristic in each of the positive-phase signal, generated by one operational amplifier, and the reverse-phase signal, generated by two operational amplifiers, are unbalanced.

In addition, the capacitor is used to prevent the direct current voltage from returning (feedback); however, in the audio equipment or the like, there is such a technical problem that the material of the electrode foil of the capacitor or the material of a dielectric substance of the capacitor may deteriorate the outputted signal characteristics and may deteriorate sound quality.

The subject to be solved by the present invention includes the aforementioned problems as one example. It is therefore an object of the present invention to provide a balanced amplifier capable of outputting a balanced signal in good quality to which a direct current voltage is superimposed, and an electronic circuit provided with the balanced amplifier.

Means for Solving the Subject

Balanced Amplifier

The above object of the present invention can be achieved by a balanced amplifier provided with: a first operational amplifier whose reverse-phase input terminal is connected to an input voltage source and whose reverse-phase input terminal is connected to an output terminal of the first operational amplifier; a second operational amplifier whose positive-phase input terminal is connected to the input voltage source and whose reverse-phase input terminal is connected to an output terminal of the second operational amplifier; and a voltage division circuit for dividing a reference voltage supplied from a reference voltage source, the reference voltage source being connected to a positive-phase input terminal of each of the first operational amplifier and the operational amplifier through the voltage division circuit.

According to the balanced amplifier of the present invention, a reverse-phase signal of an input signal (in other words, a signal which is out of phase to the input signal by 180 degrees) is generated by inputting the input signal supplied from the input voltage source to the reverse-phase input terminal of the first operational amplifier. At this time, the output terminal of the first operational amplifier is connected to the reverse-phase input terminal of the first operational amplifier. That is, it has such a structure that the output of the first operational amplifier returns (feedback) to the reverse-phase input terminal of the first operational amplifier. As described above, the first operational amplifier performs an operation like an inverting amplifier.

Incidentally, the expression that "A is connected to B" in the present invention is not limited to the direct connection between A and B without anything intervening therebetween. For example, it also includes, in effect, the connection between A and B with a reverse or the like intervening therebetween.

On the other hand, a positive-phase signal of the input signal (in other words, a signal which is in phase with the input signal) is generated by inputting the input signal supplied from the input voltage source to the positive-phase input terminal of the second operational amplifier. At this time, the output terminal of the second operational amplifier is connected to the reverse-phase input terminal of the second operational amplifier. That is, it has such a structure that the output of the second operational amplifier returns to the reverse-phase input terminal of the second operational amplifier. As described above, the second operational amplifier performs an operation like a non-inverting amplifier.

In particular, the balanced amplifier of the present invention is further provided with: the reference voltage source for outputting e.g. the direct current reference voltage; and the voltage division circuit for dividing the reference voltage. The reference voltage is divided on the voltage division circuit and then inputted to each of the positive-phase input terminal of the first operational amplifier and the positive-phase input terminal of the second operational amplifier. More specifically, the reference voltage is divided on the voltage division circuit for the input to the first operational amplifier, and the reference voltage divided for the input to the first operational amplifier is inputted to the positive-phase input terminal of the first operational amplifier. Moreover, the reference voltage is divided on the voltage division circuit for the input to the second operational amplifier, and the reference voltage divided for the input to the second operational amplifier is inputted to the positive-phase input terminal of the second operational amplifier.

As a result, from the output terminal of the first operational amplifier, a reverse-phase signal to which the reference voltage inputted from the reference voltage source is superimposed (or to which a predetermined extent of voltage according to the reference voltage is superimposed) is outputted. From the output terminal of the second operational amplifier, a positive-phase signal to which the reference voltage inputted from the reference voltage source is superimposed (or to which a predetermined extent of voltage according to the reference voltage is superimposed) is outputted.

As described above, according to the balanced amplifier of the present invention, although it generates the positive-phase signal and the reverse-phase signal to each of which the reference voltage, which is e.g. a direct current signal, is superimposed, it has the same number of operational amplifiers used for the generation of the positive-phase signal and for the generation of the reverse-phase signal. Thus, there is little or no chance of the delay in time (or phase shift) between the positive-phase signal and the reverse-phase signal. In addition, it is possible to almost match the noise characteristic and the distortion characteristic or the like in each of the positive-phase signal and the reverse-phase signal. By this, it is possible to preferably generate the balanced signal (i.e. each of the positive-phase signal and the reverse-phase signal) in relatively good quality to which the direct current signal is superimposed.

In addition, it is unnecessary to use a capacitor for preventing the reference voltage from returning (feedback). Thus, it is possible to preferably prevent the deterioration of the signal characteristic of the balanced signal caused by the material of the electrode foil of the capacitor or the material of the dielectric substance of the capacitor. As a result, it is possible to preferably prevent the deterioration of the sound quality of music outputted from audio equipment using the balanced amplifier of the present invention. Moreover, without limiting the technical effect on the audio equipment, the balanced amplifier can perform an operation in a direct current zone.

In one aspect of the balanced amplifier of the present invention, the voltage division circuit is provided at least with: a first resistance and a second resistance connected between the output terminal of the first operational amplifier and the reference voltage source; and a third resistance and a fourth resistance connected between the output terminal of the second operational amplifier and the reference voltage source, the positive-phase input terminal of the second operational amplifier is connected between the first resistance and the second resistance, and a positive-phase input terminal of the first operational amplifier is connected between the third resistance and the fourth resistance.

According to this aspect, the reference voltage is divided for the input to the first operational amplifier, in accordance with each of the first resistance and the second resistance of the voltage division circuit, and the reference voltage divided for the input to the first operational amplifier is inputted to the positive-phase input terminal of the first operational amplifier. Moreover, the positive-phase input terminal of the first operational amplifier is connected between the first resistance and the second resistance. Thus, if the output terminal of the first operational amplifier is connected to the first resistance, the first resistance is connected to the second resistance, and the second resistance is connected to the reference voltage source, the reference voltage divided for the input to the first operational amplifier is inputted to the positive-phase input terminal of the first operational amplifier through the second resistance. In addition, in this case, it has such a structure that the output of the first operational amplifier returns to the positive-phase input terminal of the first operational amplifier through the first resistance of the voltage division circuit.

Similarly, the reference voltage is divided for the input to the second operational amplifier, in accordance with each of the third resistance and the fourth resistance of the voltage division circuit, and the reference voltage divided for the input to the second operational amplifier is inputted to the positive-phase input terminal of the second operational amplifier. Moreover, the positive-phase input terminal of the second operational amplifier is connected between the third resistance and the fourth resistance. Thus, if the output terminal of the second operational amplifier is connected to the third resistance, the third resistance is connected to the fourth resistance, and the fourth resistance is connected to the reference voltage source, the reference voltage divided for the input to the second operational amplifier is inputted to the positive-phase input terminal of the second operational amplifier through the fourth resistance. In addition, in this case, it has such a structure that the output of the second operational amplifier returns to the positive-phase input terminal of the second operational amplifier through the third resistance of the voltage division circuit.

By this, as described above, it is possible to preferably generate the balanced signal (i.e. each of the positive-phase signal and the reverse-phase signal) in relatively good quality to which the direct current signal is superimposed. Moreover, by adjusting the resistance value of each of the first resistance, the second resistance, the third resistance, and the fourth resistance, as occasion demands, it is possible to adjust the circuit characteristics of the balanced amplifier and to superimpose the reference voltage having a desired voltage value to the positive-phase signal and the reverse-phase signal.

In an aspect of the balanced amplifier provided with each of the first resistance, the second resistance, the third resistance, and the fourth resistance, as described above, the output terminal of the first operational amplifier may be connected to the positive-phase input terminal of the second operational amplifier through the first resistance, the output terminal of the second operational amplifier may be connected to the positive-phase input terminal of the first operational amplifier through the fourth resistance, and the reference voltage source may be connected to each of the second resistance and the third resistance.

By virtue of such construction, it has such a structure that the reference voltage divided for the input to the first operational amplifier is inputted to the positive-phase input terminal of the first operational amplifier through the second resistance, and that the output of the first operational amplifier returns to the positive-phase input terminal of the first operational amplifier through the first resistance.

Similarly, it has such a structure that the reference voltage divided for the input to the second operational amplifier is inputted to the positive-phase input terminal of the second operational amplifier through the third resistance, and that the output of the second operational amplifier returns to the positive-phase input terminal of the second operational amplifier through the fourth resistance.

By this, as described above, it is possible to preferably generate the balanced signal (i.e. each of the positive-phase signal and the reverse-phase signal) in relatively good quality to which the direct current signal is superimposed.

In an aspect of the balanced amplifier provided with each of the first resistance, the second resistance, the third resistance, and the fourth resistance, as described above, the positive-phase input terminal of the second operational amplifier may be connected between the first resistance and the second resistance through a fifth resistance, and the positive-phase input terminal of the first operational amplifier may be connected between the third resistance and the fourth resistance through a sixth resistance.

By virtue of such construction, it has such a structure that the reference voltage divided for the input to the first operational amplifier is inputted to the positive-phase input terminal of the first operational amplifier through each of the second resistance and the fifth resistance, and that the output of the first operational amplifier returns to the positive-phase input terminal of the first operational amplifier through each of the first resistance and the fifth resistance.

Similarly, it has such a structure that the reference voltage divided for the input to the second operational amplifier is inputted to the positive-phase input terminal of the second operational amplifier through each of the third resistance and the sixth resistance, and that the output of the second operational amplifier returns to the positive-phase input terminal of the second operational amplifier through each of the fourth resistance and the sixth resistance.

By this, as described above, it is possible to preferably generate the balanced signal (i.e. each of the positive-phase signal and the reverse-phase signal) in relatively good quality to which the direct current signal is superimposed. Moreover, in addition to or instead of adjusting the resistance value of each of the first resistance, the second resistance, the third resistance, and the fourth resistance, by adjusting the resistance value of each of the fifth resistance and the sixth resistance, as occasion demands, it is possible to adjust the circuit characteristics of the balanced amplifier and to superimpose the reference voltage having a desired voltage value to the positive-phase signal and the reverse-phase signal.

In an aspect of the balanced amplifier provided with the fifth resistance and the sixth resistance, as described above, each resistance value of the first resistance, the second resistance, and the fifth resistance may be substantially the same as each resistance value of the third resistance, the fourth resistance, and the sixth resistance. Alternatively, each ratio of the first resistance, the second resistance, and the fifth resistance may be substantially the same as each ratio of the third resistance, the fourth resistance, and the sixth resistance.

By virtue of such construction, it is possible to superimpose the reference voltage having substantially the same voltage value, to each of the positive-phase signal and the reverse-phase signal.

Electronic Circuit

The above object of the present invention can be achieved by an electronic circuit provided with the aforementioned balanced amplifier of the present invention (including its various aspects).

The electronic circuit of the present invention can receive the same various benefits as those of the balanced amplifier of the present invention described above. As one specific example of the electronic circuit of the present invention, for example, an A/D converter or the like can be listed. In addition, various electronic circuits using the balanced signal can be listed as one specific example of the electronic circuit of the present invention.

Incidentally, in response to various aspects of the balanced amplifier of the present invention described above, the electronic circuit of the present invention can also employ various aspects.

These effects and other advantages of the present invention will become more apparent from the embodiment explained below.

As explained above, according to the balanced amplifier of the present invention, it is provided with: the input voltage source; the first operational amplifier; the second operational amplifier; the reference voltage source; and the voltage division circuit. Therefore, it is possible to preferably generate the balanced signal in relatively good quality to which the direct current signal is superimpose.

BRIEF DESCRIPTION OF DRAWINGS

FIG. 1 is a circuit diagram conceptually showing the circuit structure of a balanced amplifier in an embodiment.

FIG. 2 is a circuit diagram conceptually showing the circuit structure of a balanced amplifier in a comparative example.

FIG. 3 is a block diagram conceptually showing the basic structure of an A/D converter driving circuit using the balanced amplifier in the embodiment.

DESCRIPTION OF REFERENCE CODES

1 balanced amplifier
11, 12 operational amplifier
20 resistance
30 input voltage source
40 reference voltage source
50 differential A/D converter driving circuit

BEST MODE FOR CARRYING OUT THE INVENTION

Hereinafter, the best mode for carrying out the present invention will be explained with reference to the drawings.

Hereinafter, an embodiment of the present invention will be explained with reference to the drawings.

Firstly, with reference to FIG. 1, a balanced amplifier in the embodiment of the present invention will be explained. FIG. 1 is a circuit diagram conceptually showing the circuit structure of the balanced amplifier in the embodiment.

As shown in FIG. 1, a balanced amplifier 1 is provided with: an operational amplifier 11, which constitutes one specific example of the "first operational amplifier" of the present invention; an operational amplifier 12, which constitutes one specific example of the "second operational amplifier 12" of the present invention; a resistance 20a; a resistance 20b; a resistance 20c; a resistance 20d, which constitutes one specific example of the "sixth resistance" of the present invention; a resistance 20e; a resistance 20f; a resistance 20g; a resistance 20h, which constitutes one specific example of the "fifth resistance" of the present invention; a resistance 20i, which constitutes one specific example of the "first resistance" of the present invention; a resistance 20j, which constitutes one specific example of the "second resistance" of the present invention; a resistance 20k, which constitutes one specific example of the "third resistance" of the present invention; and a resistance 20l, which constitutes one specific example of the "fourth resistance" of the present invention. Moreover, the balanced amplifier 1 is connected to an input voltage source 30 and a reference voltage source 40.

The input voltage source 30 is connected to a reverse-phase input terminal (or inverting input terminal) of the operational amplifier 11 through the resistance 20a, and it is connected to a positive-phase input terminal (or non-inverting input terminal) of the operational amplifier 12 through the resistance 20g.

The output terminal of the operational amplifier 11 is connected to the reverse-phase input terminal of the operational amplifier 11 through the resistance 20b. In other words, the output of the operational amplifier 11 returns (i.e. feedback) to the resistance-phase input terminal of the operational amplifier 11 through the resistance 20b. Moreover, the positive-phase input terminal of the operational amplifier 11 is earthed through the resistance 20c.

That is, the operational amplifier 11 operates as an inverting amplifier in the balanced amplifier 1. Therefore, from the output terminal of the operational amplifier 11, the reverse-phase signal of an input signal (in other words, input voltage), which is inputted from the input voltage source 30, is outputted.

The output terminal of the operational amplifier 12 is connected to the reverse-phase input terminal of the operational amplifier 12 through the resistance 20f. In other words, the output of the operational amplifier 12 returns (i.e. feedback) to the reverse-phase input terminal of the operational amplifier 12 through the resistance 20f. Moreover, the reverse-phase input terminal of the operational amplifier 12 is earthed through the resistance 20e.

That is, the operational amplifier 12 operates as a non-inverting amplifier in the balanced amplifier 1. Therefore, from the output terminal of the operational amplifier 12, the positive-phase signal of the input signal, which is inputted from the input voltage source 30, is outputted.

In particular, in the embodiment, the output terminal of the operational amplifier 11 is connected to the reference voltage source 40 through the resistances 20i and 20j. Moreover, the output terminal of the operational amplifier 11 is connected to the positive-phase input terminal of the operational amplifier 12 through the resistances 20i and 20h. In other words, the output of the operational amplifier 11 returns to the positive-phase input terminal of the operational amplifier 12 through the resistances 20i and 20h. Then, a reference voltage inputted from the reference voltage source 40 is divided (specifically, e.g. stepped down) at least in accordance with the resistance value of each of the resistances 20i and 20j and then inputted to the positive-phase input terminal of the operational amplifier 12. That is, the resistances 20i and 20j constitute a voltage division circuit.

The output terminal of the operational amplifier 12 is connected to the reference voltage source 40 through the resistances 20i and 20k. Moreover, the output terminal of the operational amplifier 12 is connected to the positive-phase input terminal of the operational amplifier 11 through the resistances 20i and 20d. In other words, the output of the operational amplifier 12 returns to the positive-phase input terminal of the operational amplifier 11 through the resistances 20l and 20d. Then, the reference voltage inputted from the reference voltage source 40 is divided (specifically, e.g. stepped down) at least in accordance with the resistance value of each of the resistances 20k and 20l and then inputted to the positive-phase input terminal of the operational amplifier 11. That is, the resistances 20k and 20l constitute a voltage division circuit.

Hereinafter, a specific explanation will be given on what an output Vo_1 and an output Vo_2 of the balanced amplifier 1 having the above structure are like, using circuit equations illustrated.

Firstly, it is defined that the resistance value of the resistance 20a is "R1", the resistance value of the resistance 20b is "R2", the resistance value of the resistance 20c is "R3", the resistance value of the resistance 20d is "R4", the resistance value of the resistance 20e is "R5", the resistance value of the resistance 20f is "R6", the resistance value of the resistance 20g is "R7", the resistance value of the resistance 20h is "R8", the resistance value of the resistance 20i is "R9", the resistance value of the resistance 20j is "R10", the resistance value of the resistance 20k is "R11", and the resistance value of the resistance 20l is "R12".

At this time, with regard to a feedback coefficient "B1" of a feedback circuit on the side of the reverse-phase input terminal of the operational amplifier 11, B1=R1/(R1+R2). With regard to a feedback coefficient "B2" of a feedback circuit on the side of the positive-phase input terminal of the operational amplifier 11, B2=R3/(R3+R4). With regard to a feedback coefficient "B3" of a feedback circuit on the side of the reverse-phase input terminal of the operational amplifier 12, B3=R5/(R5+R6). With regard to a feedback coefficient "B4" of a feedback circuit on the side of the positive-phase input terminal of the operational amplifier 12, B4=R7/(R7+R8).

Moreover, with regard to a damping coefficient "K1" of the voltage division circuit including the resistances 20i and 20j, K1=R10/(R9+R10). With regard to a damping coefficient "K2" of the voltage division circuit including the resistances 20k and 20l, K2=R11/(R11+R12).

Here, for simplification of explanation, the following explanation is carried under the assumption that R9<<R8, R10<<R8, R11<<R4, R12<<R4 and that an input voltage (i.e. a voltage of the input signal) Vi is "0V". If the reference voltage is Vref [V], the output Vo_1 and output Vo_2 of the balanced amplifier 1 are expressed by the following equations 1 and 2, respectively.

$$\text{Vo\_1} = V\text{ref} \frac{\{-B2B3(1-K2) - B2B4(1-K1)K2\}}{-B1B3 + K1K2B2B4} \quad \text{[Equation 1]}$$

$$\text{Vo\_2} = V\text{ref} \frac{\{-B1B4(1-K1) - B2B4(1-K2)K1\}}{-B1B3 + K1K2B2B4} \quad \text{[Equation 2]}$$

Moreover, if each of the feedback coefficients is constant (i.e. B1=B2=B3=B4=B) and each of the damping coefficients is constant (i.e. K1=K2=K), the aforementioned equations 1 and 2 are expanded as in the aforementioned equations 3 and 4, respectively.

$$Vo\_1 = Vref \frac{\{-B^2(1-K) - B^2(1-K)K\}}{-B^2 + K^2B^2} \quad \text{[Equation 3]}$$
$$= Vref \frac{-(1-K)B^2(1+K)}{B^2(K^2-1)}$$
$$= Vref \frac{B^2(K^2-1)}{B^2(K^2-1)}$$
$$= Vref$$

$$Vo\_2 = Vref \frac{\{-B^2(1-K) - B^2(1-K)K\}}{-B^2 + K^2B^2} \quad \text{[Equation 4]}$$
$$= Vref \frac{-(1-K)B^2(1+K)}{B^2(K^2-1)}$$
$$= Vref \frac{B^2(K^2-1)}{B^2(K^2-1)}$$
$$= Vref$$

As shown in the equations 3 and 4, it is clear that the reference voltage Vref [V] is superimposed to the output Vo_1 of the operational amplifier 11 and the output Vo_2 of the operational amplifier 12. This shows the case that the input voltage is "0 [V]". Thus, in the case that the input voltage is "Vi [V]", if the gain of the operational amplifier 11 is "A1" and the gain of the operational amplifier 12 is "A2", the output Vo_1 of the operational amplifier 11 is −A1Vi+Vref [V] and the Vo_2 of the operational amplifier 12 is A2Vi+Vref [V].

As described above, according to the balanced amplifier 1 in the embodiment, it is possible to output a balanced signal to which the reference voltage, which is a direct current voltage, is superimposed.

Here, with reference to FIG. 2, an explanation will be given on a balanced amplifier in a comparative example, which can output the balanced signal to which the reference signal, which is the direct current voltage, is superimposed, similarly to the balanced amplifier 1 in the embodiment. FIG. 2 is a circuit diagram conceptually showing the circuit structure of the balanced amplifier in the comparative example.

As shown in FIG. 2, a balanced amplifier 100 in the comparative example is provided with: an operational amplifier 111; an operational amplifier 112; an operational amplifier 113; an operational amplifier 114; a resistance 200*a*; a resistance 200*b*; a resistance 200*c*; a resistance 200*d*; a resistance 200*e*; a resistance 200*f*; a capacitor 500*a*; and a capacitor 500*b*. Moreover, the balanced amplifier 100 is connected to an input voltage source 300 and a reference voltage source 400.

An input signal from the input voltage source 300 is inputted to the positive-phase input terminal of the operational amplifier 111 and is outputted to the output terminal of the operational amplifier 111 a positive-phase signal of the input signal.

A positive-phase signal outputted to the output terminal of the operational amplifier 111 is inputted to the reverse-phase input terminal of the operational amplifier 114 through the capacitor 500*b* and the resistance 200*d*. To the positive-phase input terminal of the operational amplifier 114, a reference voltage supplied from the reference voltage source 400 is inputted. Therefore, from the output terminal of the operational amplifier 114, a positive-phase signal to which the reference voltage, which is the direct current voltage, is superimposed, as an output Vo_2.

On the other hand, the positive-phase signal outputted to the output terminal of the operational amplifier 111 is also inputted to the reverse-phase input terminal of the operational amplifier 112 through the resistance 200*a*. As a result, from the output terminal of the operational amplifier 112, a reverse-phase signal of the positive-phase signal (i.e. a reverse-phase signal of the input signal) is outputted.

The reverse-phase signal outputted to the output terminal of the operational amplifier 112 is inputted to the reverse-phase input terminal of the operational amplifier 113 through the capacitor 500*a* and the resistance 200*c*. To the input terminal of the operational amplifier 113, the reference voltage supplied from the reference voltage source 400 is inputted. Therefore, from the output terminal of the operational amplifier 113, the reverse-phase signal to which the reference voltage, which is the direct current voltage, is superimposed, as an output Vo_1.

As described above, the balanced amplifier 100 in the comparative example can also output the balanced signal to which the reference voltage, which is the direct current voltage, is superimposed, similarly to the balanced amplifier 1 in the embodiment.

The balanced amplifier 1 in the embodiment, however, has advantages more excellent in the following points.

Firstly, in the balanced amplifier 1 in the embodiment, the number of operational amplifiers used for the generation of the positive-phase signal is same as that of operational amplifiers for the generation of the reverse-phase signal. That is, the positive-phase signal is generated by using the operational amplifier 12, and the reverse-phase signal is generated by using the operational amplifier 11. Thus, it is unnecessary to use the operational amplifiers arranged in series for the generation of the positive-phase signal and the reverse-phase signal, so that there is little or no chance of the delay in time (or phase shift) between the positive-phase signal and the reverse-phase signal. Moreover, it is possible to almost match the noise characteristic and the distortion characteristic or the like in each of the positive-phase signal and the reverse-phase signal. By this, the balanced amplifier 1 in the embodiment has such a great advantage that it is possible to preferably generate the balanced signal (i.e. each of the positive-phase signal and the reverse-phase signal) in relatively good quality to which the reference voltage, which is the direct current voltage, is superimposed.

In addition, the balanced amplifier 1 in the embodiment does not have to use the capacitor for preventing the reference voltage, inputted to the balanced amplifier 1, from returning (feedback) to the side of the operational amplifier 11 and the operational amplifier 12. Thus, it is possible to preferably prevent the deterioration of the signal characteristic of the balanced signal caused by the material of electrode foil of the capacitor or the material of the dielectric substance of the capacitor. As a result, the balanced amplifier 1 can perform an operation in a direct current zone.

Moreover, because it is possible to preferably prevent the deterioration of the signal characteristic of the balanced signal caused by the material of electrode foil of the capacitor or the material of the dielectric substance of the capacitor, if the balanced amplifier 1 in the embodiment (more specifically, a differential A/D converter driving circuit provided with the balanced amplifier 1 in the embodiment, described later) is used to the audio equipment for playing music, it is possible to preferably prevent the deterioration of the sound quality of the music played by the audio equipment. Now, with reference to FIG. 3, a brief explanation will be given on the differential A/D converter driving circuit provided with the balanced amplifier 1 in the embodiment. FIG. 3 is a block diagram conceptually showing the basic structure of the A/D converter driving circuit using the balanced amplifier in the embodiment.

As shown in FIG. 3, a differential A/D converter driving circuit 50 is provided with: the balanced amplifier 1; and a conversion circuit 2.

An analog signal Vi inputted to the differential A/D converter driving circuit 50 (i.e. the input signal inputted from the input voltage source in FIG. 1) is firstly inputted to the balanced amplifier 1. Then, from the balanced amplifier 1, a reverse-phase signal of the analog signal Vi and a positive-phase signal of the analog signal Vi (i.e. balanced signal) are outputted and then inputted to the conversion circuit 2. At this time, the reference voltage Vref [V] inputted from the reference voltage source 40 is superimposed to each of the reverse-phase signal of the analog signal Vi and the positive-phase signal of the analog signal Vi. In this case, the reference voltage Vref [V] inputted from the reference voltage source 40 is preferably about half of an operating voltage Vcc [V] of the differential A/D converter driving circuit. That is, preferably, Vref=Vcc/2.

On the conversion circuit 2 to which the reverse-phase signal of the analog signal Vi and the positive-phase signal of the analog signal Vi are inputted, predetermined signal processing is performed on the reverse-phase signal of the analog signal Vi and the positive-phase signal of the analog signal Vi, to thereby output a digital signal Vd corresponding to the analog signal Vi.

Incidentally, as described above, if each of the feedback coefficients is constant (i.e. B1=B2=B3=B4=B) and each of the damping coefficients is constant (i.e. K1=K2=K), the reference voltage can be superimposed to the balanced signal. Specifically, it is only necessary that a ratio of R1 and R2, a ratio of R3 and R4, a ratio of R5 and R6, and a ratio of R7 and R8 are equal to each other and that a ratio of R9 and R10 and a ratio of R11 and R12 are equal to each other. However, from the viewpoint of matching the reference voltage values superimposed to the positive-phase signal and the reverse-phase signal, R9 is preferably equal to R11, and R10 is preferably equal to R12. Similarly, R4 is preferably equal to R5.

Moreover, in the explanation of the circuit equations shown above, the explanation was given under the condition that R9<<R8, R10<<R8, R11<<R4, R12<<R4. However, even if the condition is not satisfied, the aforementioned explanation of the circuit equations can be applied as it is, by adding a resistance value of the circuit in which R9 and R10 which are connected in parallel, to R8 and by adding a resistance value of the circuit in which R11 and R12 are connected in parallel, to R4.

Moreover, as the reference voltage source 40, it is preferable to use a constant voltage source using a shunt constant voltage element or the like. This is because the reference voltage source 40 and the positive-phase input terminal of each of the operational amplifier 11 and the operational amplifier 12 are connected through the voltage division circuit including the resistances 20j, 20k, and the like, and the reference voltage source 40 needs to supply an electric current to the voltage division circuit.

Moreover, an example of the electronic circuit using the balanced amplifier 1 in the embodiment is not limited to the aforementioned differential A/D converter driving circuit 50. The balanced amplifier 1 in the embodiment can be obviously used for various electronic circuits or the like which need to use the balanced signal and which need to generate the balanced signal.

The present invention is not limited to the aforementioned embodiment, and various changes may be made without departing from the essence or spirit of the invention which can be read from the claims and the entire specification. A balanced amplifier and an electronic circuit, all of which involve such changes, are also intended to be within the technical scope of the present invention.

The invention claimed is:

1. A balanced amplifier comprising:
   a first operational amplifier whose reverse-phase input terminal is connected to an input voltage source and whose reverse-phase input terminal is connected to an output terminal of said first operational amplifier;
   a second operational amplifier whose positive-phase input terminal is connected to the input voltage source and whose reverse-phase input terminal is connected to an output terminal of said second operational amplifier; and
   a voltage division circuit for dividing a reference voltage supplied from a reference voltage source,
   the reference voltage source being connected to a positive-phase input terminal of each of said first operational amplifier and said second operational amplifier through said voltage division circuit,
   wherein said voltage division circuit comprises at least:
   a first resistance and a second resistance connected between the output terminal of said first operational amplifier and the reference voltage source; and
   a third resistance and a fourth resistance connected between the output terminal of said second operational amplifier and the reference voltage source,
   the positive-phase input terminal of said second operational amplifier is connected between the first resistance and the second resistance, and
   a positive-phase input terminal of said first operational amplifier is connected between the third resistance and the fourth resistance.

2. The balanced amplifier according to claim 1, wherein
   the output terminal of said first operational amplifier is connected to the positive-phase input terminal of said second operational amplifier through the first resistance,
   the output terminal of said second operational amplifier is connected to the positive-phase input terminal of said first operational amplifier through the fourth resistance, and
   the reference voltage source is connected to each of the second resistance and the third resistance.

3. The balanced amplifier according to claim 2, wherein
   the positive-phase input terminal of said second operational amplifier is connected between the first resistance and the second resistance through a fifth resistance, and
   the positive-phase input terminal of said first operational amplifier is connected between the third resistance and the fourth resistance through a sixth resistance.

4. The balanced amplifier according to claim 3, wherein each ratio of the first resistance, the second resistance and the fifth resistance is substantially the same as each ratio of the third resistance, the fourth resistance, and the sixth resistance.

5. The balanced amplifier according to claim 3, wherein each resistance value of the first resistance, the second resistance, and the fifth resistance is substantially the same as each resistance value of the third resistance, the fourth resistance, and the sixth resistance.

6. An electronic circuit comprising the balanced amplifier according to claim 1.

* * * * *